US010534057B2

(12) United States Patent
Liu et al.

(10) Patent No.: US 10,534,057 B2
(45) Date of Patent: Jan. 14, 2020

(54) METHOD FOR DIXON MRI, MULTI-CONTRAST IMAGING AND MULTI-PARAMETRIC MAPPING WITH A SINGLE MULTI-ECHO GRADIENT-RECALLED ECHO ACQUISITION

(71) Applicant: Maria Drangova, London, Ontario (CA)

(72) Inventors: Junmin Liu, London (CA); Maria Drangova, London (CA)

( * ) Notice: Subject to any disclaimer, the term of this patent is extended or adjusted under 35 U.S.C. 154(b) by 125 days.

(21) Appl. No.: 15/917,508

(22) Filed: Mar. 9, 2018

(65) Prior Publication Data
US 2018/0259607 A1    Sep. 13, 2018

Related U.S. Application Data

(60) Provisional application No. 62/470,164, filed on Mar. 10, 2017.

(51) Int. Cl.
*G01R 33/561* (2006.01)
*G01R 33/56* (2006.01)
*G01R 33/24* (2006.01)

(52) U.S. Cl.
CPC ....... *G01R 33/5607* (2013.01); *G01R 33/243* (2013.01); *G01R 33/5608* (2013.01); *G01R 33/5616* (2013.01)

(58) Field of Classification Search
CPC ............ G01R 33/5607; G01R 33/5608; G01R 33/5616; G01R 33/243; G01R 33/4828; G01R 33/50; A61B 5/055

USPC .......................................................... 324/309
See application file for complete search history.

(56) References Cited

U.S. PATENT DOCUMENTS

| | | | |
|---|---|---|---|
| 2012/0049846 A1* | 3/2012 | Gross ............... | G01R 33/565 324/309 |
| 2012/0268120 A1* | 10/2012 | Hernando .......... | G01R 33/4828 324/309 |
| 2013/0243290 A1* | 9/2013 | Poonawalla ....... | G01R 33/4828 382/131 |
| 2014/0114178 A1* | 4/2014 | Dale ................. | G01R 33/50 600/416 |

(Continued)

*Primary Examiner* — Patrick Assouad
*Assistant Examiner* — Demetrius R Pretlow

(57) ABSTRACT

To perform Dixon MRI, generate multi-contrast images, and extract multi-parametric maps, this invention presents a multi-echo gradient echo protocol with two sets of echo trains. An example implementation of the invention at 3 T acquires a short-TE train ($\Delta TE \sim 1.2$ ms, TE<10 ms), which is used to map B0 inhomogeneity and proton density fat fraction (FF), and a second—susceptibility sensitive—long-TE train (16 ms<TE<45 ms) will enable quantification of local frequency shift (LFS) and susceptibility. The presented pipeline automatically generates co-registered images and maps with/without fat-suppressed, including magnitude- and complex-based FF map, B0 map, anatomical images, brain mask, R2* map, unwrapped phase maps for each echo, susceptibility-sensitive images (SWI, LFS and quantitative susceptibility) for each echo, mean susceptibility-sensitive images for each echo-train. The invention is directly applicable to whole head/neck, liver, knee or even whole body scans with sliding table.

12 Claims, 13 Drawing Sheets

(56) References Cited

U.S. PATENT DOCUMENTS

| | | | | |
|---|---|---|---|---|
| 2014/0375318 A1* | 12/2014 | Dagher | ............... | G01R 33/243 |
| | | | | 324/309 |
| 2017/0038446 A1* | 2/2017 | Liu | ..................... | A61B 5/4872 |
| 2017/0102439 A1* | 4/2017 | McMillan | ........ | G01R 33/56572 |
| 2017/0350951 A1* | 12/2017 | Samsonov | ........... | G01R 33/485 |
| 2018/0098711 A1* | 4/2018 | Leporq | ................. | A61B 5/055 |
| 2019/0128984 A1* | 5/2019 | Sung | ...................... | G06T 7/136 |

* cited by examiner

240

242 — calcuate the Hermitian products between the late echoes and the first echo 244 — remove the phase term caused by B0 in homogeneity 246 — perform phase unwrapping and recover the removed the phase term 248 — generate the final phase maps

Fig. 2D

METHOD FOR DIXON MRI, MULTI-CONTRAST IMAGING AND MULTI-PARAMETRIC MAPPING WITH A SINGLE MULTI-ECHO GRADIENT-RECALLED ECHO ACQUISITION

CROSS-REFERENCE TO RELATED APPLICATION

This application claims priority of U.S. Provisional application Ser. No. 62/470,164, filed Mar. 10, 2017. The content of the prior application is incorporated herein by reference in its entirety.

TECHNICAL FIELD

This disclosure relates to magnetic resonance imaging (MR), particularly, generating Dixon MRI, multi-contrast imaging and multi-parametric mapping by processing the signals collected with a single multi-echo gradient echo acquisition.

BACKGROUND

Multi-echo gradient echo (mGRE) sequences have been widely adapted in clinical and scientific practice for different purposes due to their capability of generating multi-contrast images and extracting multi-parametric maps. Using the magnitude mGRE data, $R2^*$ relaxivity ($R2^*=1/T2^*$) mapping techniques (1) have been used to quantify blood oxygenation level dependent functional MRI, detect and track of super-magnetic iron oxides, visualize abnormalities of the articular knee, assess iron content in brain, liver and heart. However, a few newer techniques have been developed using the commonly discarded phase data. Among these, susceptibility weighted imaging (SWI) (2) uses the phase information to enhance the susceptibility contrast of the magnitude image to visualize veins, microbleeds, hemorrhage, clot, etc; local frequency shift (LFS) mapping techniques (3) characterize anatomical structures based on phase-contrast features; relying on the LFS maps, quantitative susceptibility mapping (QSM) techniques (4) have also been explored to quantify susceptibility ($\chi$), which is an intrinsic property of materials (e.g., iron, calcium, biological tissue). Also, a few mGRE-based Dixon MRI techniques (5-7) have been developed to jointly estimate B0 inhomogeneity, proton density fat-fraction (FF), $R2^*$ and $\chi$, using the complex mGRE data.

The mGRE sequences can be prescribed to cover a large volume in clinically acceptable scan times when the acquisition is conducted using multi-channel RF coils with a large number coil-elements and employing parallel imaging techniques. Compared to 2D multi-slice acquisitions, 3D mGRE acquisition strategies can also generate high-resolution ($\leq 1$ mm) data sets with higher SNR (8) and have been proven to be useful for many applications, such as stroke, oncology, multiple sclerosis, etc. However, the performance of the $R2^*$, SWI, LFS and QSM techniques for imaging large volumes might be downgraded by many confounding factors, particularly, the presence of macroscopic B0 inhomogeneity and fat content (9). A popular approach to avoid the effects of fat on the measured $R2^*$ is to acquire only "in-phase" echoes, i.e., the prescribed echo times (TEs) lead the phase differences caused by chemical shift between fat and water to be equal to a multiple of $2\pi$. However, the "in-phase" approach is based on a single-peak fat model, despite the fact that the fat spectrum has many peaks. If an accurate B0 map is known, the effect of B0 on the measured $R2^*$ could be compensated. Because macroscopic B0 inhomogeneity is also the dominant source of the measured phase signal, an accurate B0 map is crucial for the accurate background-phase removal performed for all phase-sensitive techniques (Dixon MRI, SWI, LFS and QSM). Furthermore, an accurate B0 map enables elimination of the phase component caused by chemical shift when fat is present.

In most of the reported work (10), a set of TEs optimized for Dixon Mill, i.e., short first TE and small echo spacing ($\Delta$TE), was used for data acquisition. U.S. Patent Application 2014/0142417 A1 discloses a method of using the separated water and fat images, as well as B0 inhomogeneity map to estimate the QSM values from Dixon Mill data. U.S. Patent Application 2015/0002148 A1 discloses a method of joint estimating fat-water fraction and the QSM values by iteratively refining fat chemical shift.

However, a set of long echo times (TE) with large $\Delta$TE may be needed to match the tissue $T2^*$ and optimize susceptibility effects for some cases, e.g., brain imaging using $R2^*$, SWI, LFS and QSM. While the concept of acquiring mGRE images with two echo trains has been considered previously (11), no process has been developed which fully optimizes the acquisition parameters, and corrects for the effect of B0 on the phase-sensitive images.

BRIEF SUMMARY OF THE INVENTION

To address the aforementioned challenge, the present invention collects signals with a single mGRE sequence with variable echo spacing within each TR that contains both a short $\Delta$TE echo train to capture water-fat and B0 phase shifts (for FF and B0 mapping) and a longer $\Delta$TE echo train (and long echo times) to capture subtle susceptibility variations and $R2^*$ information.

The present invention corrects the phase errors associated with bipolar acquisition for performing Dixon MRI in order to map FF and B0 inhomogeneity. Then, the present invention uses the derived B0 map to address the challenges during phase processing for whole-head QSM and SWI, such as background removal and phase unwrapping.

The invention presents a fully automated post-processing pipeline. The invention automatically generates co-registered images and maps as follows: 1) magnitude-based and complex-based FF map; 2) B0 map; 3) anatomical images with/without fat-suppression; 4) brain mask; 5) $R2^*$ from the short-TE train and $R2^*$ from all echoes with FF compensation; 6) unwrapped phase maps for each echo except the first echo; 7) SWI, LFS and QSM maps with/without fat-suppression for each echo except the first echo; 8) mean SWI, LFS and QSM with/without fat-suppression for the short- and long-TE trains separately.

The invention is directly applicable to whole head/neck, liver, knee or even whole body scans with sliding table.

BRIEF DESCRIPTION OF THE DRAWINGS

Embodiments will now be described, by way of example only, with reference to the drawings, in which:

FIG. 2d is a flowchart illustrating a method of an example embodiment of phase unwrapping of the present disclosure.

DETAILED DESCRIPTION

Acquisition Protocol

Figure 1:
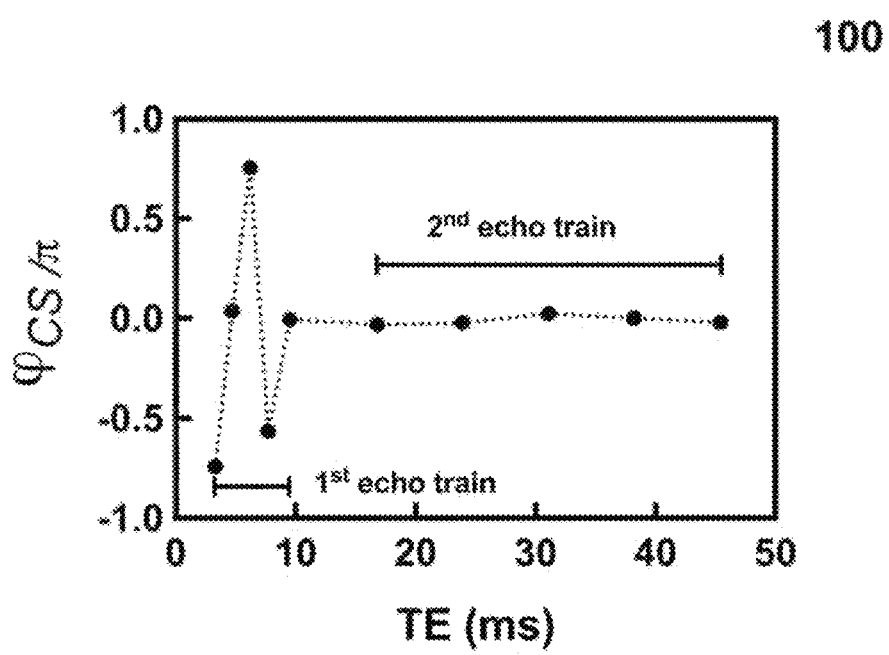
FIG. 1 plots the phase shift caused by chemical-shift between fat and water vs. echo times.

The 3D multi-echo GRE protocol 100 was optimized for a 3 T scanner, based on a scan-time constraint of ~5 min and a spatial resolution of 1.0×1.0×2.0 mm³ over the whole head (and neck). The mGRE protocol includes two sets of echo trains: the first five echoes (short-TE train) were selected with TEs optimized for Dixon MRI (3.3, 4.7, 6.2, 7.7 and 9.5 ms); the late five echoes (long-TE train) were designed with TEs optimized for susceptibility mapping (16.8, 23.9, 31.1, 38.2, and 45.4 ms) while keeping fat and water approximately in-phase. FIG. 1 shows the phase evolution of a fat-only voxel (FF=1) at these selected TEs. Here a six-peak fat model (12) was used to calculate the chemical shift (CS)-related phase values as follows:

$$\varphi_{CS}(FF, TE_j) = \text{angle}((1-FF) + FF\Sigma_{m=1}^{M} a_m e^{i2\pi \Delta f_m TE_j}), \quad [1]$$

where $a_m$ is the known relative intensity of the $m^{th}$ peak of the fat spectrum, $\Delta f_m$ is the corresponding relative frequency shift from water, and M (=6) is the total number of peaks of the multi-peak fat model. To ensure optimal TEs for the short-TE train, bipolar readout gradients were used.

Flowchart of the Post-Processing Pipeline

Figure 2A:
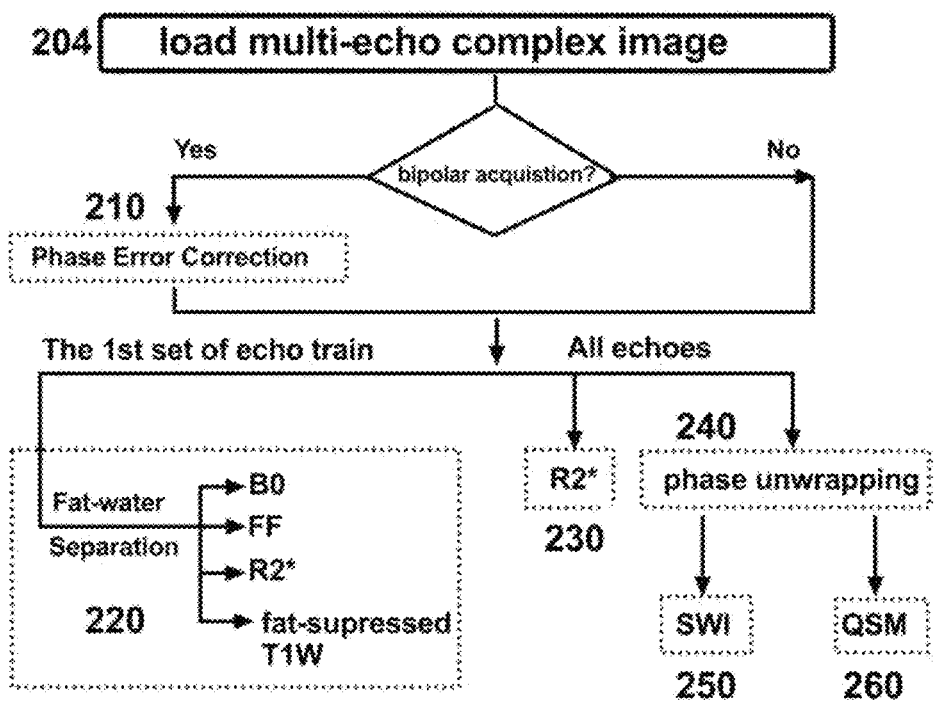
FIG. 2a is a flowchart illustrating a method of an example embodiment of the present disclosure.
Figure 2B:
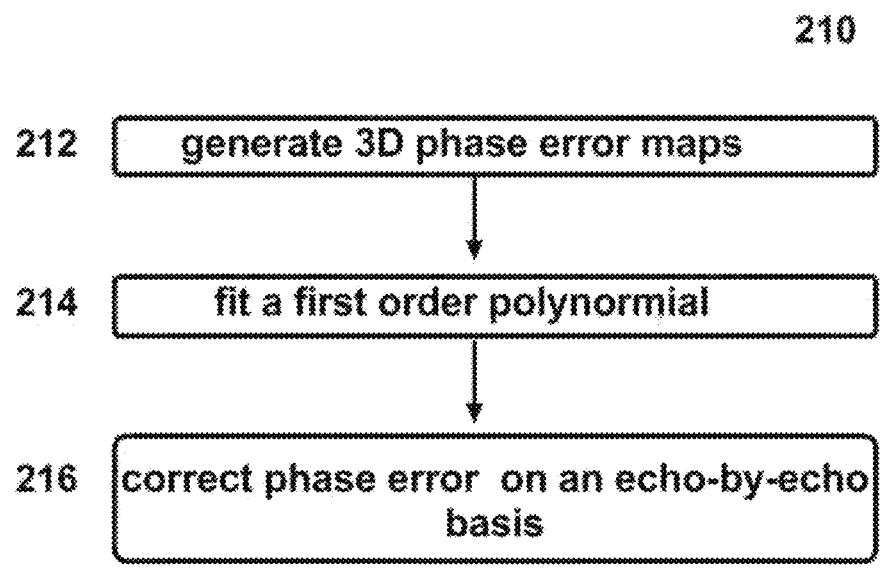
FIG. 2b is a flowchart illustrating a method of an example embodiment of phase error correction of the present disclosure.
Figure 2C:
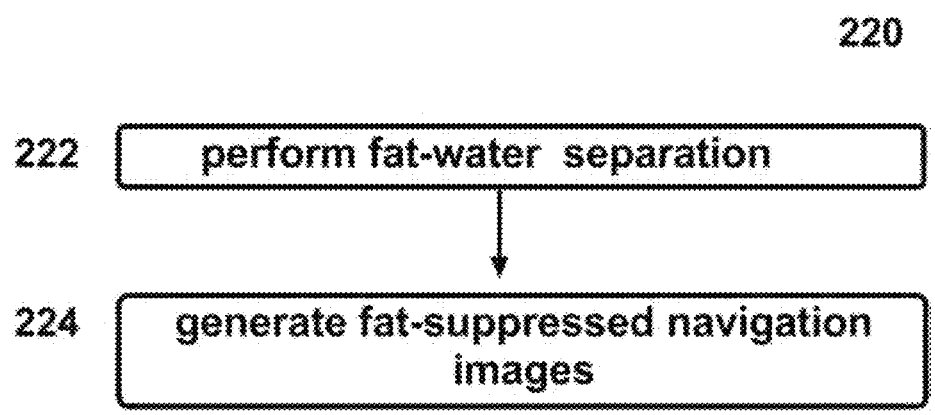
FIG. 2c is a flowchart illustrating a method of an example embodiment of generating fat-suppressed anatomical image of the present disclosure.

The proposed pipeline 200 is summarized in the flowchart of FIG. 2. Step 204 loads the collected multi-echo complex data. Step 210 corrects the phase errors associated with the bipolar acquisition over all echoes. In procedure 212, the phase error, $\theta_{bi}$, can be estimated from the first three echoes according to:

$$\theta_{bi} = \text{unwrap}(\text{angle}((S_{2,bi} \times S^*_{3,bi}) \times (S_{2,bi} \times S^*_{1,bi})))/4, \quad [2]$$

where $S_{j,bi}$ is the complex MRI signal at the $j^{th}$ echo using bipolar acquisition.

In procedure 214, the final θ is obtained by fitting a first order polynomial to the 3D volume of the unwrapped phase, $\theta_{bi}$.

In procedure 216, the phase-error-corrected complex signal $S_j$ is calculated as follows:

$$S_j = S_{j,bi} \times e^{(-1)^j \times \theta}. \quad [3]$$

The data sets resulting from the procedure described in Eq. [3] are ready for use with established fat-water separation and QSM algorithms, as if they were acquired using unipolar gradients.

Procedure 222 of Step 220 processes the short-TE train data using the B0-NICE method (13), which generates a B0 field ($\Delta f_{B0}$) map, a fat-water R2* map, a complex-based FF map and a magnitude-based FF map. The procedure 224 generates fat-suppressed anatomical images by multiplying the averaged magnitude images of the first echo-train by (1−FF).

Step 230 processes the magnitude signal of all echoes to generate an R2* map. We compute the R2* for each voxel by fitting an exponential decay curve:

$$|S_j| = S_0 \times F_{CS}(FF, TE_j) \times e^{-R^*2TE_j}, \quad [4]$$

where $S_0$ is the apparent proton density at TE=0; $F_{CS}$ is the CS-related F-function and is defined as follow, $$F_{CS}(FF, TE_j) = |(1-FF) + FF(\Sigma_{m=1}^{M} a_m e^{i2\pi \Delta f_m TE_j})|, \quad [4a]$$

where FF is determined from Step 220. Note that an R2* map based on the short-TE train only can be calculated, as well as one using all echoes.

Step 240 performs phase unwrapping of the phase signal of all echoes. To mitigate the issue related to imperfections in channel combination and B1-related phase components, the Hermitian products (HP) between the late echoes and the first echo are calculated 242 prior to mapping the LFS and QSM, $$S_{j,1} = S_j \times S^*_1. \quad [5]$$

To reduce the difficulty of spatial phase unwrapping, the phase term derived from the B0 map (Step 220) was removed on an echo-by-echo basis 244 as follows:

$$S_{j,1,b0} S_{j,1} e^{-2\pi \Delta f_{B0} \times (TE_j - TE_1)}. \quad [6]$$

Procedure 246 generates the unwrapped phase as follows:

$$\varphi_{tmp} = \text{unwrap}(\text{angle}(S_{j,1,b0})) + 2\pi \Delta f_{B0} \times (TE_j - TE_1). \quad [7]$$

Because Step 220 involves blurring by a boxcar filter, which does not preserve edges, procedure 248 derives the edge-recovered final unwrapped phase for each echo as follows:

$$\varphi_j = (\text{angle}(S_{j,1}) - 2\pi \times \text{round}((\text{angle}(S_{j,1}) - \varphi_{tmp})/2\pi). \quad [8]$$

Step 250 combines the phase and magnitude information to generate susceptibility weighted images (SWI) images on an echo-by-echo basis (j>1). The unwrapped phase map is high-pass filtered by applying 2D Gaussian filter (σ=7 mm) (14). A phase mask is generated by setting the positive phase values to 1, the phase values less than $-\pi$ to 0, and the others linearly converted to the range of (0 1]. The phase-mask is applied a number of times.

Step 260 generates local frequency shift (LFS) and QS maps for each echo (j>1). The LFS map is generated using the Laplacian boundary value (LBV) method (15) for each individual echo. QS maps are generated by performing dipole inversion from the LFS maps using the thresholded k-space division (TKD) method (16) (threshold value=0.19).

Experiements

Three healthy volunteers were scanned under a protocol approved by the local research Ethics Board. All exams were conducted on a 3 T scanner (Prisma, Siemens, Erlangen Germany) using a 64-channel head/neck coil. Scanning parameters were: flip angle 15°; TR 51 ms; flow compensation of the first echo; readout along anterior/posterior direction; readout bandwidth 1015 Hz/pixel; spatial resolution $1.0 \times 1.0 \times 2.0$ mm$^3$; acceleration factor=2. For Subject #1 and #2, the acquisition matrix was equal to $224 \times 168 \times 80$ for covering whole head within ~5 minutes scanning time; for Subject #3, the acquisition matrix was equal to $224 \times 168 \times 96$ for covering the whole head and upper neck within ~6 minutes.

Data were processed off-line by the fully automatic approach implemented in MATLAB (MathWorks, Natick, Mass.). Channel-combined complex images were obtained from the scanner.

Phase unwrapping (Step 210 and 240) was achieved using the PUROR unwrapping algorithm (17).

Performing background phase removal for generating the brain LFS map (Step 260) requires a binary brain mask, which is used to identify brain tissues. The current implementation determined the mask using the magnitude-based FF maps determined from Step 220, because they are not sensitive to phase errors. Specifically, the FF maps were filtered using the 3D Gaussian filter ($\sigma$=5 mm), followed by generating the mask by thresholding the filtered FF maps (threshold value=0.25).

EXAMPLES

Figure 3:
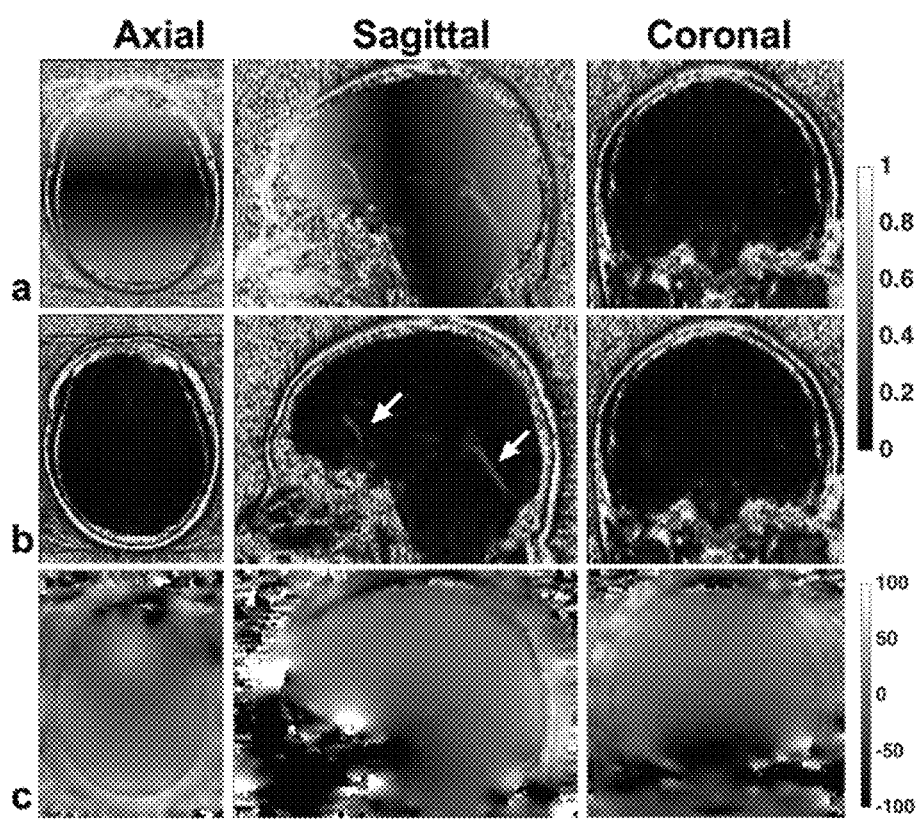
FIG. 3 shows the results of phase-error correction and Dixon MRI from Subject #1: (a) FF maps without phase error correction; (b) and (c) are the FF and field (unit in Hz) maps with phase error correction, respectively. For each row, from left to right are the central slices in the three different orientations.
Figure 4:
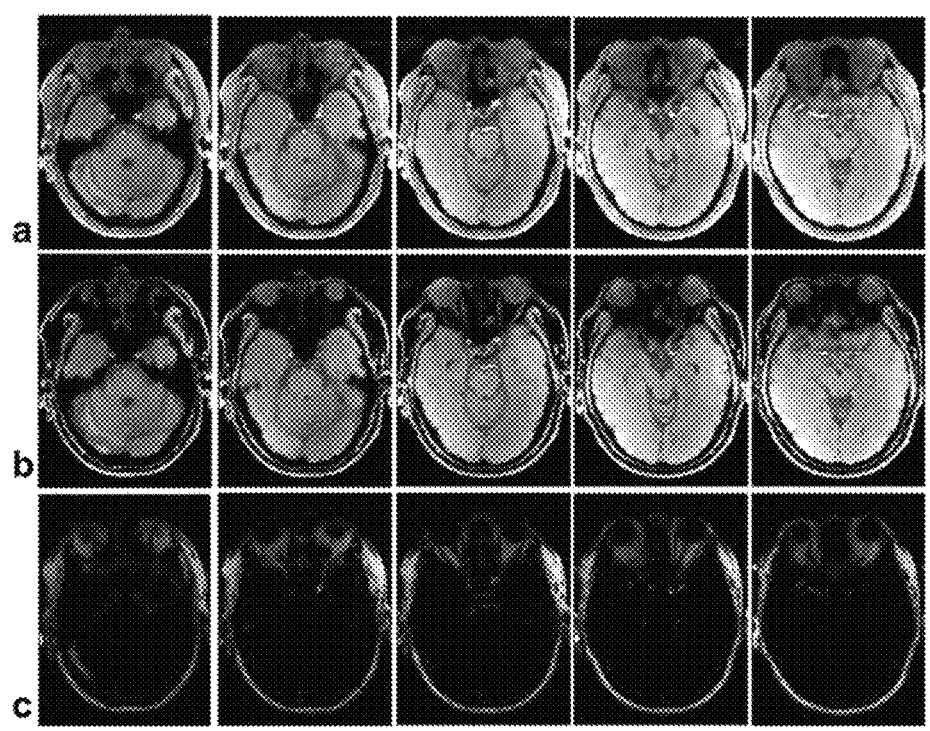
FIG. 4 shows the results of fat-water separation of five representative axial images from Subject #1: (a) anatomical images (b) water-only (i.e., fat-suppressed) and (c) fat-only.

FIGS. 3 to 8 show the intermediate and the final results from Subject #1 as an example of how each step of the pipeline processes the bipolar mGRE data. FIGS. 3 and 4 show the fat-water separation results (Step 220). Without applying phase error correction (i.e., if Step 210 is skipped), the calculated FF maps (FIG. 3a) were not uniform throughout the brain, as expected. The success of Step 210 is demonstrated by the improved quality of the FF images of FIG. 3b, which have a uniform distribution of FF values throughout the brain and no fat-water swaps are present in the brain or neck regions, while flow artifacts are observable as suggested by arrows.

FIG. 4 shows a few examples when using the aforedetermined FF map to generate water-only (FIG. 4b) and fat-only (FIG. 4c) images from the anatomical images (FIG. 4a). These results suggest that uniform fat signal suppression of the anatomical images is obtained; slices covering the region around the optic nerve were selected because fat suppression is commonly required when imaging this area. The arrows point to regions corrupted by large B0 inhomogeneity.

Figure 5:
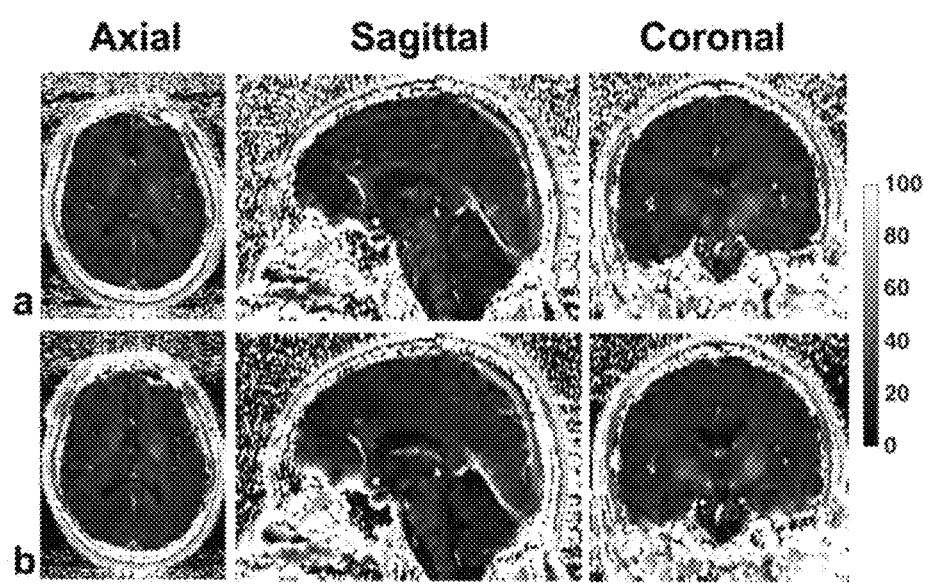
FIG. 5 shows the results of R2* mapping from Subject #1: (a) and (b) are the R2* maps (unit in 1/s) reconstructed from the first echo train and all echoes, respectively.

FIG. 5 shows the R2* reconstruction results (Step 220 and Step 230). The R2* maps estimated from the short-TE train from the B0-NICE method (FIG. 5a) are very noisy because the TEs (<10 ms) are very short compared to the tissue T2* values. As expected, the quality of the R2* maps (FIG. 5b) improved significantly when all echoes were included in the processing.

Figure 6:
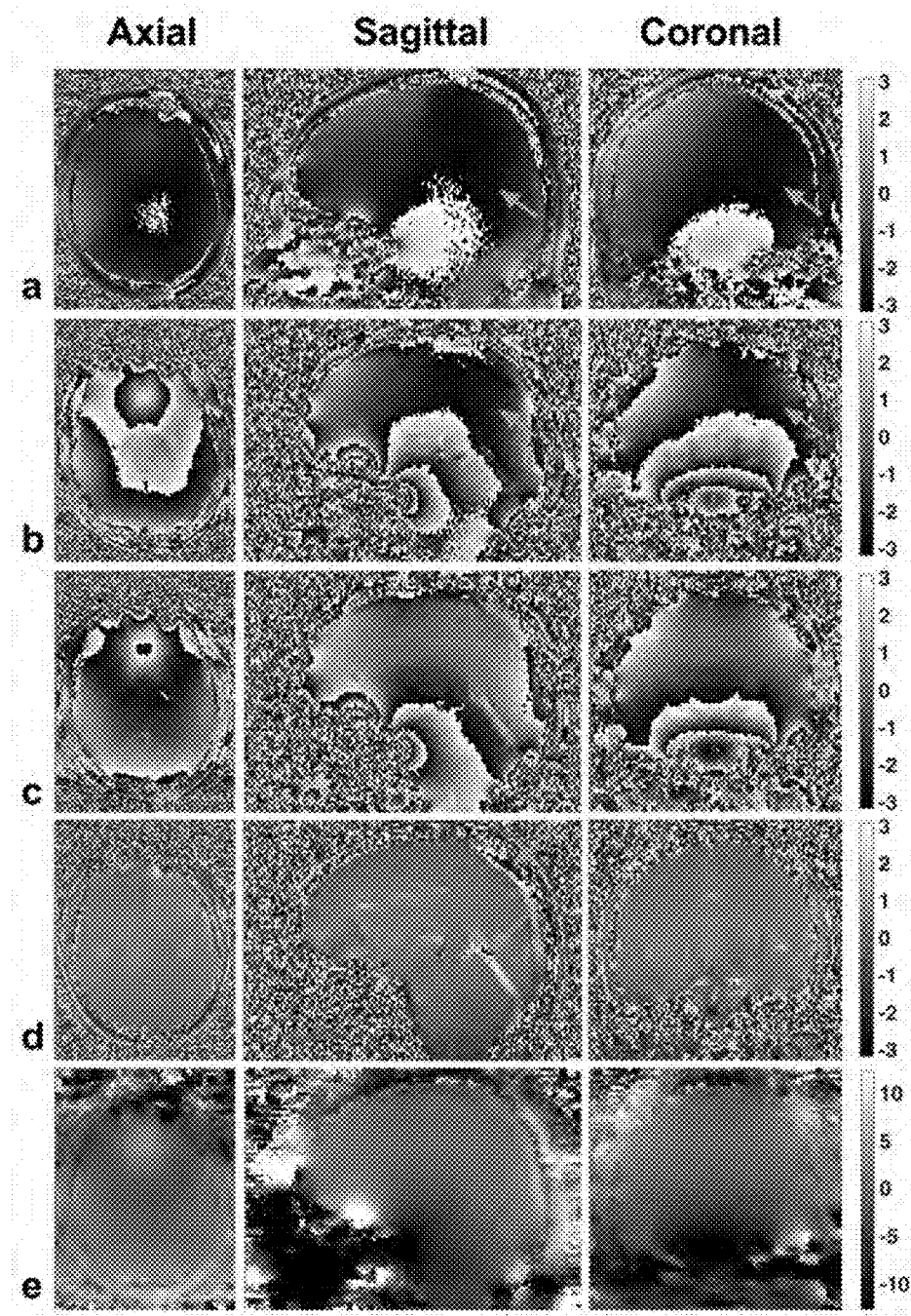
FIG. 6 shows the results of phase unwrapping from Subject #1: (a) phase maps at the first echo; (b) phase maps at the $7^{th}$ echo; (c) phase of Hermitian product of the $7^{th}$ and the first echoes ($\varphi_{7,1}$); (d) phase maps after B0 removal; (e) the final unwrapped phase maps.

FIG. 6 shows the intermediate results of processing the phase signal (Step 240). Starting with the unprocessed phase of the first (FIG. 6a) and seventh (FIG. 6b) echoes, the calculated Hermitian product (FIG. 6c) demonstrates a reduced number of phase wraps. After the phase shift caused by the B0 inhomogeneity (from FIG. 3c) is removed by Eq. [6], phase images that are nearly wrap-free are seen in FIG. 6d. Lastly, FIG. 6e shows the final unwrapped phase images, which are used as input for the SWI and QSM calculations. The arrows in FIGS. 6a and 6b point to the regions, where the smooth spatial phase variance is B1-related, which is removed by calculating HP. The arrows in FIG. 6d point to regions corrupted by phase wraps.

Figure 7:
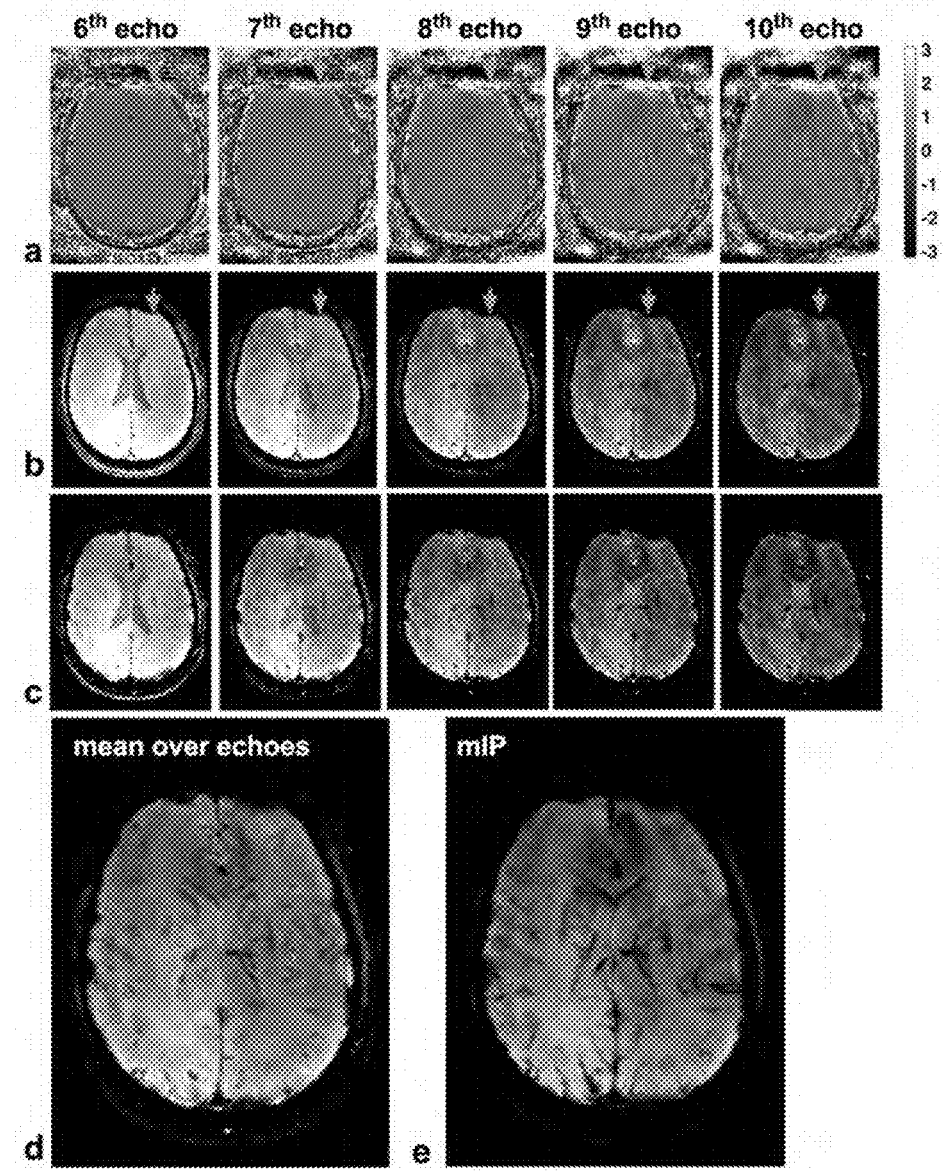
FIG. 7 shows the results of SWI from Subject #1: (a) the high-pass filtered phase maps; (b) the magnitude images; (c) the SWI images by combining FIGS. 7a and 7b; (d) the echo-combined SWI image generated by averaging the images shown in FIG. 7c; (e) Minimum intensity projection over 10 mm obtained for the echo-combined SWI.

FIG. 7 shows the multi-echo SWI reconstruction results (Step 250). The high-pass filtered phase images (FIG. 7a) suggest that the Gaussian filter removes the background phase successfully. However, artifacts are observable in regions with rapid phase changes (arrows in FIG. 7a), especially, at the later echoes. In the same regions signal loss (arrows), which becomes progressively worse with increasing echo time, is clearly seen in the magnitude images of FIG. 7b. FIG. 7c shows the SWI images calculated for each of the five late echoes; these were generated by combining the phase of FIG. 7a and magnitude of FIG. 7b. As expected, with longer TE, an increase in venographic contrast is obtained, but a decrease in SNR due to dephasing is also found. The echo-combined SWI (FIG. 7d) maintains a better image quality in terms of SNR and CNR compared to the individual-echo SWIs. FIG. 7e is a 10-mm minimum intensity projection (mIP), where additional enhancement of vessel conspicuity is seen.

Figure 8:
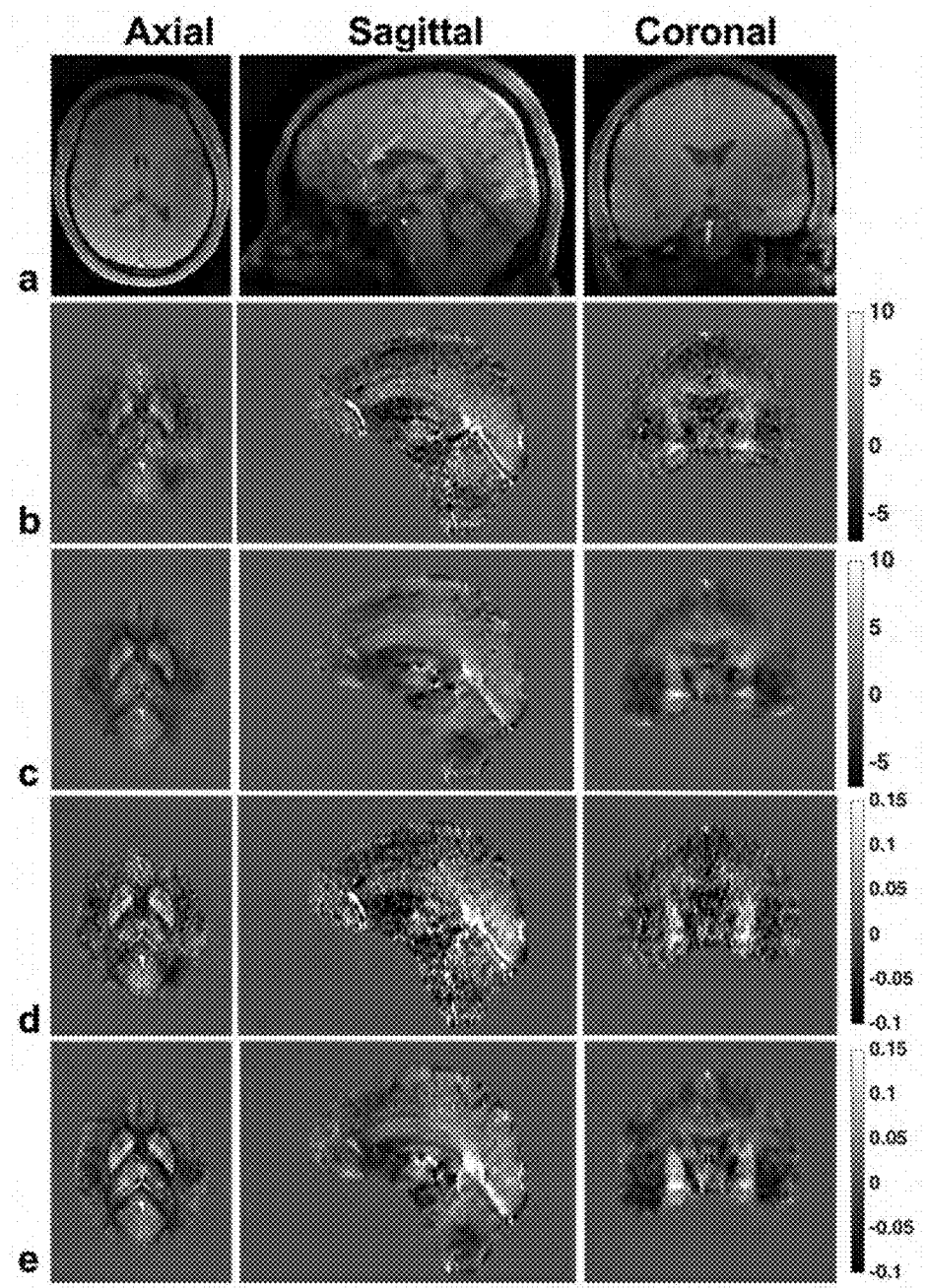
FIG. 8 shows the results of LFS and QSM from Subject #1: (a) anatomical images; (b) and (c) are the mean LFS maps (in units of Hz) obtained from the first echo train and the second echo train, respectively; (d) and (e) are the QSM maps (in units of ppm) derived from FIGS. 8b and 8c, respectively.

FIG. 8 shows the anatomical images and the multi-echo QSM (Step 260) reconstruction results. Arrows in FIG. 8a point to the big blood vessels. FIGS. 8b and 8c are the mean LFS maps for the short- and long-TE trains, respectively. These results indicate that the LBV method successfully performs background removal on an echo-by-echo basis. Comparison between FIGS. 8b and 8c shows that the late echo LFS maps have higher signal-to-noise ratio and contrast-to-noise ratio. Artifacts due to large vessels (arrows in FIG. 8a) are present in both short- and long-TE-train LFS maps. FIGS. 8d and 8e are the QSM maps derived from the mean LFS maps over the short- and the long-TE trains, respectively. Although the simple TKD (truncated k-space division) approach was used in this work, no streaking artifacts are observed, even in the sagittal and coronal planes.

Figure 9:
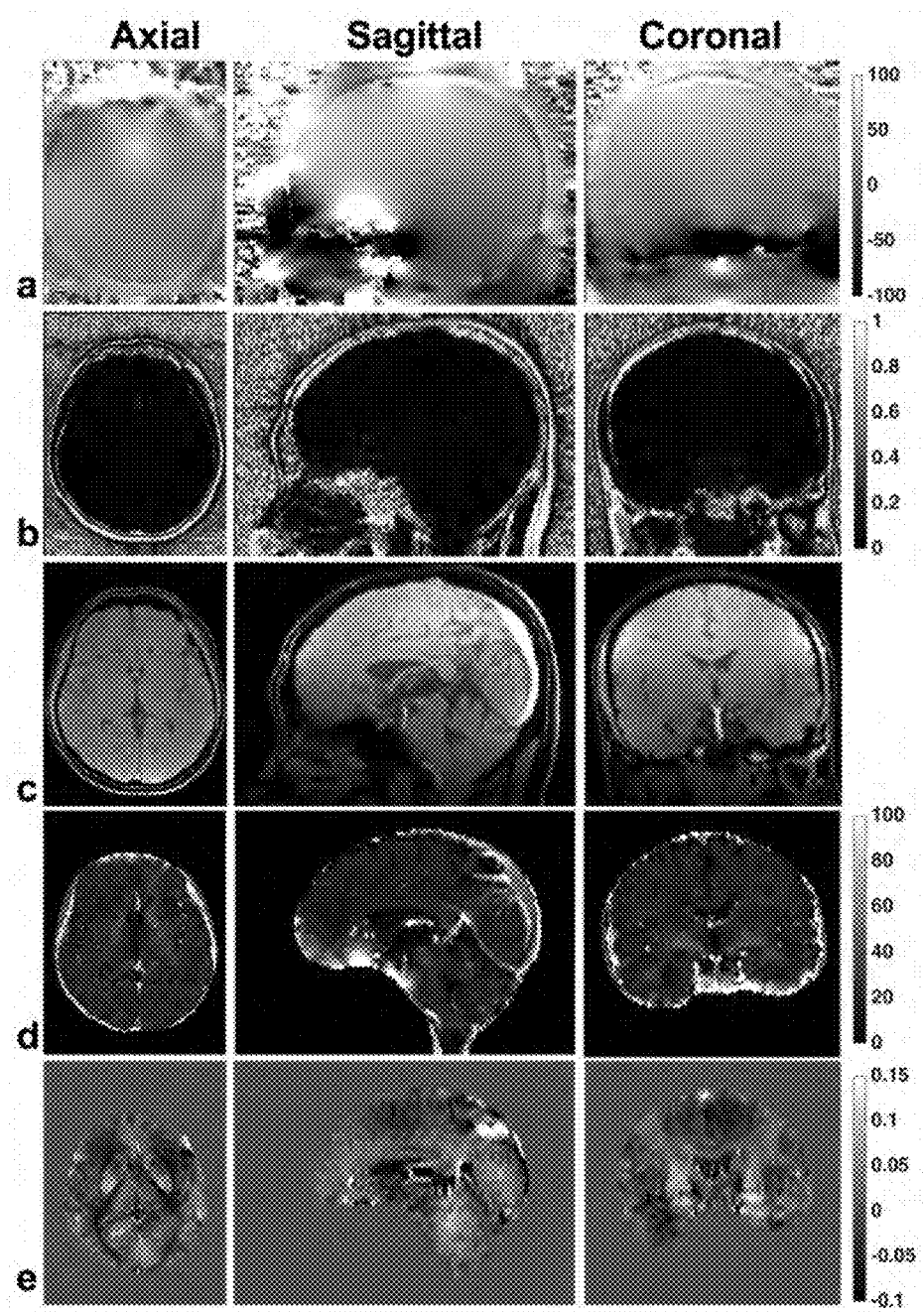
FIG. 9 shows the example results from Subject #2: (a) field maps (in units of Hz); (b) FF maps; (c) fat-suppressed anatomical images; (d) R2 maps (in units of 1/s); (e) QSM maps (in units of ppm) obtained for the late echo train.
Figure 10:
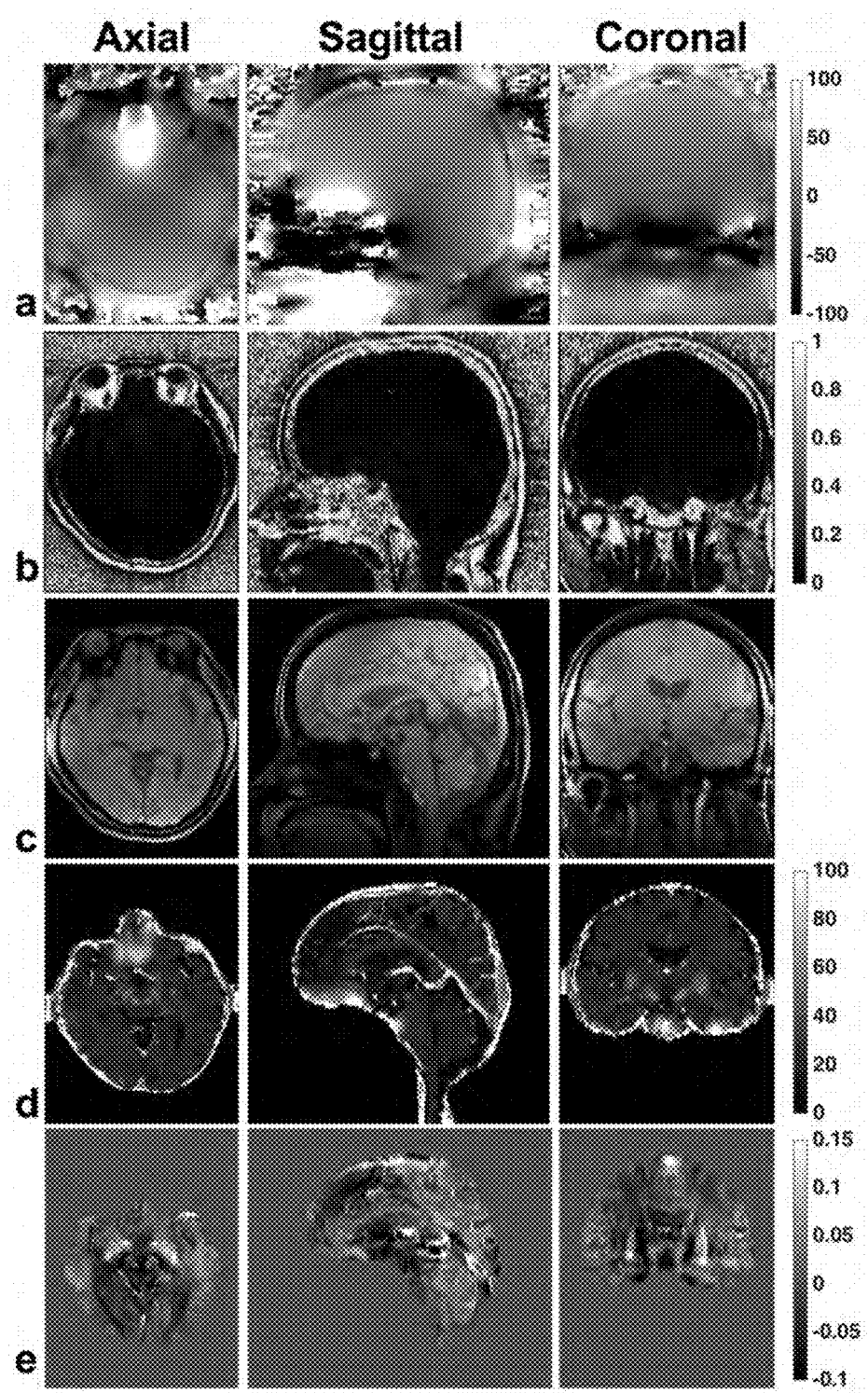
FIG. 10 shows the example results from Subject #3: (a) field maps (in units of Hz); (b) FF maps; (c) fat-suppressed anatomical images; (d) R2 maps (in units of 1/s); (e) QSM maps (unit in ppm) obtained from the second echo train.

To demonstrate the robustness of the presented processing pipeline, FIGS. 9 and 10 show the multi-parametric maps generated from the images acquired of Subjects #2 and #3, respectively. Note that for all subjects the quality of the maps remains consistent over the entire axial extent of the head. For subject 3, an additional 32 mm of neck were included in the scan to further demonstrate the effectiveness of the algorithms (FIG. 10).

Applications

The example results show that the proposed protocol and processing pipeline have the capability of performing Dixon MRI, multi-contrast imaging and multi-parametric mapping from a single multi-echo GRE scan. The Dixon Mill provides the FF and B0 maps. The FF maps determined can be used for: 1) fat suppression of the multi-contrast images and multi-parametric maps, which is very import when imaging lipid-rich regions and/or when contrast agent is used; 2) skull segmentation; 3) Dixon attenuation correction for PET/MRI. The B0 maps can be used for the following example applications: 1) background phase correction/removal; 2) image distortion correction; 3) shimming, and others.

The SWI, LFS and QSM maps obtained for each echo or were echo-averaged (i.e. values of these maps for the short and long echo trains—or all echoes—were averaged to increase SNR). The afore-mentioned maps can be used to investigate both normal tissues and the changes in tissue in various pathological conditions, which may only be identified from the TE-dependent effect. Fusing the two R2* maps—one from the short-TE train, the other from all echoes—will be useful in cases where tissues with short and long T2s coexist.

It is important to note that while whole brain data is used to demonstrate the invention, the process is directly applicable to other body parts, such as liver, knee or even whole body scans with sliding table.

REFERENCES

1. Yablonskiy D A, Sukstanskii A L, Luo J, Wang X. Voxel spread function method for correction of magnetic field inhomogeneity effects in quantitative gradient-echo-based MRI. Magn Reson Med 2013; 70(5):1283-1292.
2. Haacke E M, Xu Y, Cheng Y C, Reichenbach J R. Susceptibility weighted imaging (SWI). Magn Reson Med 2004; 52(3):612-618.
3. Duyn J H, van Gelderen P, Li T Q, de Zwart J A, Koretsky A P, Fukunaga M. High-field MRI of brain cortical substructure based on signal phase. Proc Natl Acad Sci USA 2007; 104(28):11796-11801.
4. Liu J, Liu T, de Rochefort L, et al. Morphology enabled dipole inversion for quantitative susceptibility mapping using structural consistency between the magnitude image and the susceptibility map. Neuroimage 2011; 59(3):2560-2568.
5. Sharma S D, Hernando D, Horng D E, Reeder S B. Quantitative susceptibility mapping in the abdomen as an imaging biomarker of hepatic iron overload. Magn Reson Med 2015; 74(3):673-683.
6. Dimov A V, Liu T, Spincemaille P, et al. Joint estimation of chemical shift and quantitative susceptibility mapping (chemical QSM). Magn Reson Med 2015; 73(6):2100-2110.
7. Cronin M J, Wang N, Decker K S, Wei H, Zhu W Z, Liu C. Exploring the origins of echo-time-dependent quantitative susceptibility mapping (QSM) measurements in healthy tissue and cerebral microbleeds. Neuroimage 2017; 149:98-113.
8. Hodel J, Leclerc X, Khaled W, et al. Comparison of 3D multi-echo gradient-echo and 2D T2*MR sequences for the detection of arterial thrombus in patients with acute stroke. European radiology 2014; 24(3):762-769.
9. Hernando D, Vigen K K, Shimakawa A, Reeder S B. R*(2) mapping in the presence of macroscopic B(0) field variations. Magn Reson Med 2012; 68(3):830-840.
10. Reeder S B, Pineda A R, Wen Z, et al. Iterative decomposition of water and fat with echo asymmetry and least-squares estimation (IDEAL): application with fast spin-echo imaging. Magn Reson Med 2005; 54(3):636-644.
11. Kozawa K S F, Wehrli F W, Takahashi M, Luna H. Quantatitive measurement of bone marrow composition using multi-echo gradient-echo sequence and 3-point Dixon processing. ISMRM 2000.
12. Yu H, Shimakawa A, McKenzie C A, Brodsky E, Brittain J H, Reeder S B. Multiecho water-fat separation and simultaneous R2* estimation with multifrequency fat spectrum modeling. Magn Reson Med 2008; 60(5):1122-1134.
13. Liu J, Drangova M. Method for B0 off-resonance mapping by non-iterative correction of phase-errors (B0-NICE). Magn Reson Med 2015; 74(4):1177-1188.
14. Hosseini Z, Liu J, Solovey I, Menon R S, Drangova M. Susceptibility-weighted imaging using inter-echo-variance channel combination for improved contrast at 7 tesla. J Magn Reson Imaging 2016.
15. Zhou D, Liu T, Spincemaille P, Wang Y. Background field removal by solving the Laplacian boundary value problem. NMR Biomed 2014; 27(3):312-319.
16. Marques J, Bowtell R. Application of a Fourier-based method for rapid calculation of field inhomogeneity due to spatial variation of magnetic susceptibility. Concepts in Magn Reson Part B 2005; 25B(1):65-78.
17. Liu J, Drangova M. Intervention-based multidimensional phase unwrapping using recursive orthogonal referring. Magn Reson Med 2012; 68(4):1303-1316.

Therefore what is claimed is:

1. A method for Dixon MRI, multi-contrast imaging and multi-parametric mapping with a single multi-echo gradient echo (GRE) acquisition, comprising:
    a) performing unipolar or bipolar multi-echo GRE acquisition including a short echo time (TE) train and a long TE train;
    b) performing phase error correction associated with the bipolar acquisition over all echoes if bipolar acquisition is employed;
    c) performing Dixon MRI for the short-TE train data on a magnitude-based FF proton density fat fraction (FF) map, an R2* map, a B0 field ($\Delta f_{B0}$) map and a complex-based FF map;
    d) performing averaging over the magnitude images for the short-TE train to generate an anatomical image;
    e) processing the magnitude signal of all echoes to generate an R2* map;
    f) performing phase unwrapping of each individual echo except the first echo;
    g) calculating susceptibility weighted imaging (SWI) on an echo-by echo basis based on the unwrapped phase;
    h) performing local frequency shift (LFS) mapping;
    i) performing quantitative susceptibility mapping (QSM);
    j) performing averaging of the SWI, LFS and QSM over the short-TE train and the long-TE train separately;
    k) performing fat suppression to the anatomical images, SWI images, LFS and QSM maps.

2. The step of claim 1 wherein performing multi-echo GRE acquisition comprises:
    a) selecting TEs optimized for Dixon MRI with a short first echo time and tight echo spacing (the short-TE train);
    b) selecting TEs optimized for susceptibility mapping while keeping fat and water approximately in-phase based on a multi-peak fat model (the long-TE train).

3. The step of claim 1 wherein performing phase-error correction comprises:
    a) constructing a complex data set using Hermitian product;

b) performing 3D phase unwrapping of the reconstructed complex data set;
c) performing polynomial fitting of the unwrapped phase;
d) performing phase-error correction to the odd and even echoes separately.

4. The step of claim 1 wherein performing Dixon Mill for the short-TE train data comprises:
   a) generating the magnitude-based FF and R2* maps using magnitude images based on a multi-peak fat model;
   b) generating a B0 field map and a proton density fat fraction (FF) map using complex data based on a multi-peak fat model.

5. The step of claim 1 wherein generating anatomical images comprises:
   a) averaging the magnitude images of the short-TE train.

6. The step of claim 1 wherein performing R2* mapping using all echoes comprises:
   a) correcting the magnitude images for fat-effects (using the FF) based on a multi-peak fat model;
   b) fitting the corrected magnitude images with a single-exponential curve.

7. The step of claim 1 wherein performing phase unwrapping comprises:
   a) calculating the Hermitian product between the later and the first echoes;
   b) removing the phase term related to ($\Delta f_{B0}$), resulting in an intermediate complex data set;
   c) performing 3D phase unwrapping to the intermediate complex data set;
   d) generating the final unwrapped phase by summing up the unwrapped phase for the intermediate complex data set and the $\Delta f_{B0}$-related phase, followed by performing deblurring.

8. The step of claim 1 wherein performing SWI comprises:
   a) performing high-pass filtering of the unwrapped phase;
   b) generating a phase mask from the filtered phase;
   c) multiplying the magnitude images by the phase mask multiple times;
   d) performing the above procedures on an echo-by-echo basis.

9. The step of claim 1 wherein performing LFS mapping comprises:
   a) generating a brain mask from the magnitude-based FF maps;
   b) performing background phase removal
   c) generating the final LFS map by converting phase to frequency;
   d) performing the above procedures on an echo-by-echo basis.

10. The step of claim 1 wherein performing QSM comprises:
    a) performing dipole inversion of the LFS maps;
    b) performing the above procedure on an echo-by-echo basis.

11. The step of claim 1 wherein performing fat suppression comprises:
    a) multiplying the generated images and maps by (1−FF).

12. The step of claim 9 wherein generating a brain mask comprises:
    a) performing 3D Guassian filtering to the magnitude-based FF maps;
    b) thresholding the filtered FF maps.

* * * * *